(12) United States Patent
Park et al.

(10) Patent No.: US 10,056,026 B2
(45) Date of Patent: Aug. 21, 2018

(54) GATE DRIVE INTEGRATED CIRCUIT AND DISPLAY DEVICE INCLUDING THE SAME

(71) Applicant: LG Display Co., Ltd., Seoul (KR)

(72) Inventors: JoonKyu Park, Gyeonggi-do (KR); SunYoung Kwon, Gyeongsangbuk-do (KR); ShinWoo Lee, Incheon (KR)

(73) Assignee: LG Display Co., Ltd., Seoul (KR)

( * ) Notice: Subject to any disclaimer, the term of this patent is extended or adjusted under 35 U.S.C. 154(b) by 99 days.

(21) Appl. No.: 15/379,749

(22) Filed: Dec. 15, 2016

(65) Prior Publication Data
US 2017/0193891 A1 Jul. 6, 2017

(30) Foreign Application Priority Data

Dec. 30, 2015 (KR) .................. 10-2015-0189207

(51) Int. Cl.
  *G09G 3/36* (2006.01)
  *G09G 3/20* (2006.01)
  *G11C 19/00* (2006.01)
  *H03K 19/0175* (2006.01)

(52) U.S. Cl.
  CPC ........... *G09G 3/2092* (2013.01); *G11C 19/00* (2013.01); *H03K 19/017509* (2013.01); *G09G 2300/0408* (2013.01); *G09G 2300/0814* (2013.01); *G09G 2310/0286* (2013.01); *G09G 2310/0289* (2013.01); *G09G 2310/0291* (2013.01); *G09G 2310/08* (2013.01); *G09G 2320/0646* (2013.01)

(58) Field of Classification Search
  CPC .......................... G09G 3/3674–3/3677; G09G 2310/0283–2310/0297
  See application file for complete search history.

(56) References Cited

U.S. PATENT DOCUMENTS

2007/0085812 A1* 4/2007 O. .................. G09G 3/3648
  345/100
2016/0293081 A1* 10/2016 Kitsomboonloha .. G06F 3/0416

FOREIGN PATENT DOCUMENTS

KR        20040062048 A    7/2004

* cited by examiner

*Primary Examiner* — Hang Lin
(74) *Attorney, Agent, or Firm* — Morgan, Lewis & Bockius LLP

(57) ABSTRACT

A gate drive integrated circuit (IC) for a display device includes a start pulse modulator configured to receive a start pulse or a front-end carry pulse alternating between a first logic level and a second logic level to output a modulation start pulse or a modulation carry pulse that is generated by modulating a logic level shift time of the start pulse or the front-end carry pulse; and a shift register configured to receive and sequentially output the modulation start pulse or the modulation carry pulse. The start pulse modulator is further configured to output the modulation start pulse or the modulation carry pulse having the second logic level at a time when a logic level of the start pulse or the front-end carry pulse has a third logic level between the first logic level and the second logic level.

14 Claims, 8 Drawing Sheets

GATE DRIVE INTEGRATED CIRCUIT AND DISPLAY DEVICE INCLUDING THE SAME

This application claims the benefit of the Korean Patent Application No. 10-2015-0189207 filed on Dec. 30, 2015, which is hereby incorporated by reference as if fully set forth herein.

BACKGROUND

Field of the Invention

The present invention relates to a gate drive integrated circuit (IC) and a display device including the same.

Discussion of the Related Art

With the advancement of an information-oriented society, various requirements for display devices are increasing. Therefore, various display devices, such as liquid crystal display (LCD) devices, plasma display panel (PDP) devices, or organic light emitting display devices, etc., are increasingly important.

A display device includes a display panel and a gate driver. The display panel includes a display area and a non-display area. The display area includes a plurality of data lines, a plurality of gate lines, and a plurality of pixels respectively provided in intersection portions of the data lines and the gate lines. The pixels are supplied with data voltages through the data lines when gate signals are supplied to the gate lines. The pixels emit lights having a certain brightness according to the data voltages. The non-display area is provided near the display area.

The gate driver may include a plurality of gate drive ICs, and the gate drive ICs may be mounted on gate flexible films. Each of the gate flexible films may be a chip-on-film type. The gate flexible films may be attached on the non-display area of the display panel using an anisotropic conductive film. Thus, the gate drive ICs may be connected to the non-display area.

A first gate drive IC receives a gate start pulse (GSP) from a timing controller and sequentially outputs p (where p is a positive integer) gate signals (G1 to Gp). A second gate drive IC receives the gate signal (Gp), which is last output from the first gate drive IC, as the gate start pulse and sequentially outputs p gate signals (Gp+1 to G2p). In this way, an N+1st (where N is a positive integer) gate drive IC receives a gate signal, which is last output from an Nth gate drive IC, as the gate start pulse.

The Nth gate drive IC is connected to the N+1st gate drive IC using a line-on glass (LOG) structure. Due to parasitic resistance and parasitic capacitor components that occur in the display panel and lines, the N+1st gate drive IC receives a gate signal, which is obtained through the delay of the gate signal that is last output from the Nth gate drive IC, as the gate start pulse.

Therefore, a time difference occurs between the gate signal last output from the Nth gate drive IC and a first gate signal output from the N+1st gate drive IC, and a dimming defect where a horizontal line parallel to a gate line is seen by a user occurring between the Nth gate drive IC and the N+1st gate drive IC.

SUMMARY

Accordingly, the present invention is directed to a gate drive integrated circuit (IC) and a display device including the same that substantially obviate one or more problems due to limitations and disadvantages of the related art.

An object of the present invention is to provide a gate drive IC and a display device including the same that prevent a dimming defect from occurring between gate drive ICs.

Additional features and advantages of the invention will be set forth in the description that follows, and in part will be apparent from the description, or may be learned by practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a gate drive integrated circuit (IC) comprises a start pulse modulator configured to receive a start pulse or a front-end carry pulse alternating between a first logic level and a second logic level to output a modulation start pulse or a modulation carry pulse that is generated by modulating a logic level shift time of the start pulse or the front-end carry pulse; and a shift register configured to receive and sequentially output the modulation start pulse or the modulation carry pulse, wherein the start pulse modulator is further configured to output the modulation start pulse or the modulation carry pulse having the second logic level at a time when a logic level of the start pulse or the front-end carry pulse has a third logic level between the first logic level and the second logic level.

In another aspect, a display device, comprises a display panel including a plurality of data lines, a plurality of gate lines, and a plurality of pixels connected to the plurality of data lines and the plurality of gate lines; a gate driver configured to supply gate signals to the plurality of gate lines; a data driver configured to supply data voltages to the plurality of data lines; and a timing control circuit configured to supply a gate control signal to the gate driver and to supply digital video data and a source control signal to the data driver, wherein the gate driver comprises a plurality of gate drive integrated circuits (ICs), each of the plurality of gate drive ICs including a start pulse modulator configured to receive a start pulse or a front-end carry pulse alternating between a first logic level and a second logic level to output a modulation start pulse or a modulation carry pulse that is generated by modulating a logic level shift time of the start pulse or the front-end carry pulse, and wherein the start pulse modulator is further configured to output the modulation start pulse or the modulation carry pulse having the second logic level at a time when a logic level of the start pulse or the front-end carry pulse has a third logic level between the first logic level and the second logic level.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION

Figure 1:
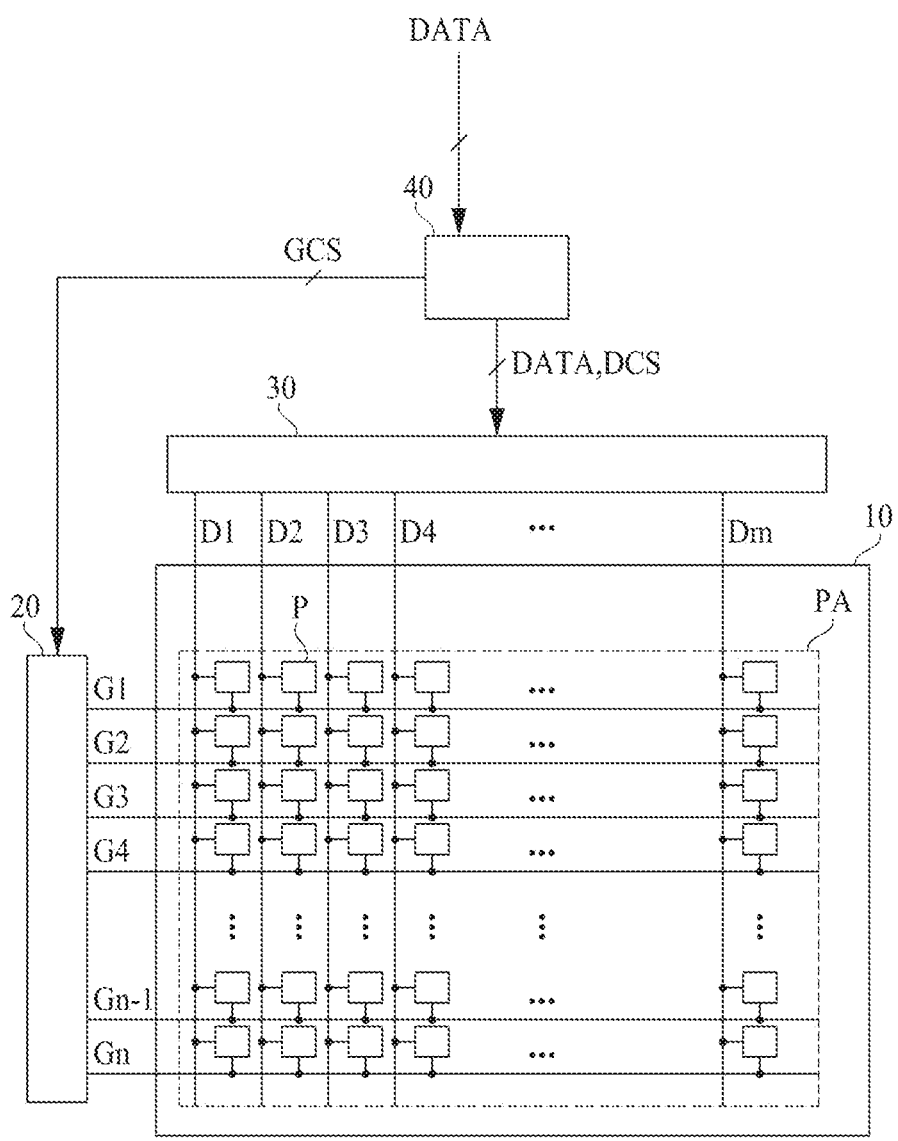
FIG. 1 is a block diagram illustrating a display device according to an example embodiment of the present invention.

Reference will now be made in detail to embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

An X axis direction, a Y axis direction, and a Z axis direction should not be construed as only a geometric relationship where a relationship therebetween is strictly vertical, and may denote having a broader directionality within a scope where elements of the present invention operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in a co-dependent relationship.

Hereinafter, exemplary embodiments of the present invention will be described in detail with reference to the accompanying drawings.

FIG. 1 is a block diagram illustrating a display device according to an example embodiment of the present invention. With reference to FIG. 1, the display device may include a display panel 10, a gate driver 20, a data driver 30, and a timing control circuit 40.

Examples of the display device may include any type of display device that supplies data voltages to a plurality of pixels through line progressive scanning, in which gate signals are sequentially supplied to a plurality of gate lines G1 to Gn. For example, the display device may be implemented using an LCD device, an organic light emitting display device, a field emission display (FED) device, or an electrophoresis display device.

The display panel 10 may include an upper substrate and a lower substrate. A plurality of data lines D1 to Dm (where m is a positive integer equal to or more than two), a plurality of gate lines G1 to Gn (where n is a positive integer equal to or more than two), and a pixel array PA including a plurality of pixels P may be provided on the lower substrate. Each of the plurality of pixels P may be connected to one of the data lines D1 to Dm and one of the gate lines G1 to Gn. Therefore, when a gate signal is supplied to a gate line, each pixel P may be supplied with a data voltage through a data line and may emit light having certain brightness according to the supplied data voltage.

Figure 2:
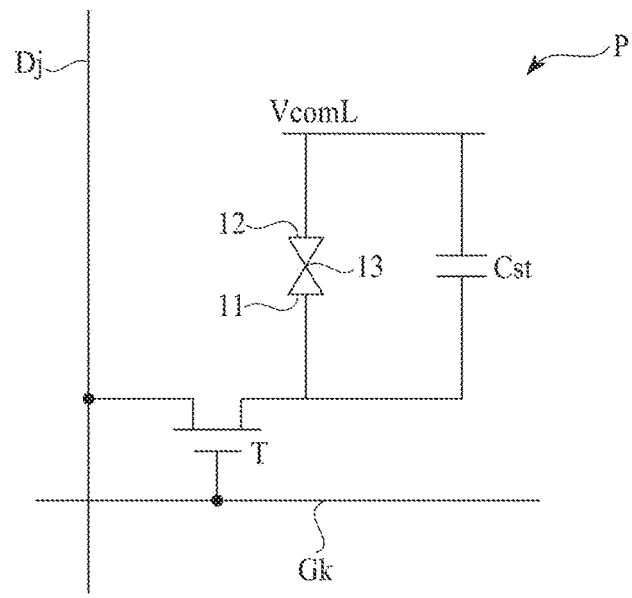
FIG. 2 is a diagram illustrating a pixel of FIG. 1.

When the display device is implemented as an LCD device, as illustrated in FIG. 2, each of the pixels P may include a transistor T, a pixel electrode 11, and a storage capacitor Cst. The transistor T may supply a data voltage of a jth (where j is a positive integer satisfying $1 \leq j \leq m$) data line Dj to the pixel electrode 11 in response to the gate signal of a kth (where k is a positive integer satisfying $1 \leq k \leq n$) gate line Gk. Therefore, each of the pixels P may drive a liquid crystal of a liquid crystal layer 13 with an electric field generated from a potential difference between the data voltage supplied to the pixel electrode 11 and a common voltage supplied to a common electrode 12, thereby controlling a transmittance of light irradiated from a backlight unit. The common electrode 12 may be supplied with the common voltage through a common voltage line VcomL, and the backlight unit may be disposed under the display panel 10 to irradiate uniform light onto the display panel 10. Also, the storage capacitor Cst may be provided between the pixel electrode 11 and the common electrode 12, and may maintain a constant voltage difference between pixel electrode 11 and the common electrode 12.

Figure 3:
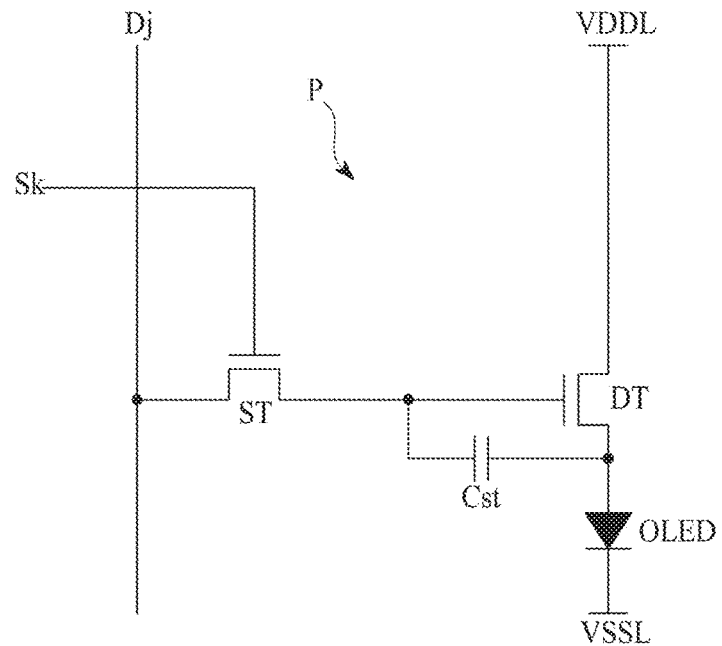
FIG. 3 is another diagram illustrating a pixel of FIG. 1.

When the display device is implemented as an organic light emitting display device, as illustrated in FIG. 3, each of the pixels P may include an organic light emitting diode OLED, a scan transistor ST, a driving transistor DT, and a storage capacitor Cst. The scan transistor ST may supply a data voltage of a jth data line Dj to a gate electrode of the driving transistor DT in response to a gate signal of a kth gate line Gk. The driving transistor DT may control a driving current flowing from a high level voltage line VDDL to the organic light emitting diode OLED according to the data voltage supplied to the gate electrode of the driving transistor DT. The organic light emitting diode OLED may be provided between the driving transistor DT and a low level voltage line VSSL, and may emit light having certain brightness according to the driving current. The storage capacitor Cst may be provided between the gate electrode and a source electrode of the driving transistor DT for maintaining a constant voltage difference between the gate electrode and the source electrode of the driving transistor DT.

The gate driver 20 may receive a gate control signal GCS from the timing control circuit 40, may generate gate signals according to the gate control signal GCS, and may respectively supply the gate signals to the gate line G1 to Gn. The gate control signal GCS may include a gate start signal (hereinafter, referred to as a "start pulse") GSP, a gate shift clock GSC, and a gate output enable signal GOE. The start pulse may be a signal for controlling an output timing of a first gate pulse corresponding to a first frame period and may swing to have a value between a first logic level and a second logic level, which is higher than the first logic level. The gate shift clock GSC may be a clock signal for shifting the gate start signal GSP. The gate output enable signal GOE may be a signal for controlling outputs of the gate signals.

The data driver 30 may receive digital video data DATA and a data control signal DCS from the timing control circuit 40, may convert the digital video data DATA into analog data voltages according to the data control signal DCS, and may respectively supply the data voltages to the data lines D1 to Dm.

The timing control circuit 40 may receive the digital video data DATA and a timing signal from an external system board (not shown). The timing signal may include a vertical synchronization signal, a horizontal synchronization signal, a data enable signal, and a dot clock. The timing control circuit 40 may generate the gate control signal GCS for controlling an operation timing of the gate driver 20 and the data control signal DCS for controlling an operation timing of the data driver 30 based on the timing signal. The timing control circuit 40 may supply the gate control signal GCS to the gate driver 20, and may supply the digital video data DATA and the data control signal (or source control signal) DCS to the data driver 30.

Figure 4:
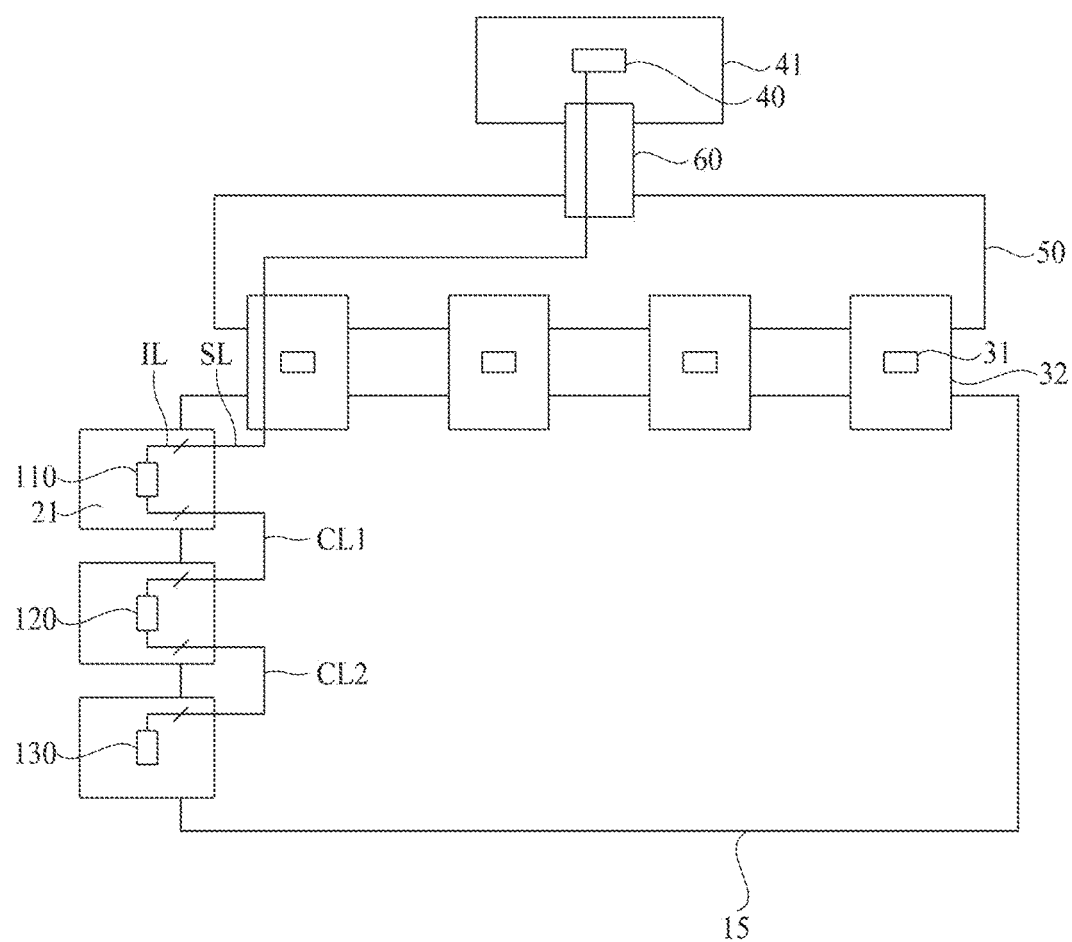
FIG. 4 is a diagram illustrating a lower substrate, gate drive ICs, gate flexible films, source drive ICs, source flexible films, a source circuit board, a control circuit board, a timing control circuit, and a carry line of a display device.

FIG. 4 is a diagram illustrating a lower substrate, gate drive ICs, gate flexible films, source drive ICs, source flexible films, a source circuit board, a control circuit board, a timing control circuit, and a carry line of a display device. In FIG. 4, for convenience of description, data lines, gate lines, and pixels provided on a lower substrate of a display panel 10 are omitted. In FIG. 4, the display device is illustrated as including three gate drive ICs 110, 120, and 130 which are dependently connected to each other, but is not limited thereto. That is, the display device may include s (where s is a positive integer equal to or more than two) gate drive ICs that are dependently connected to each other.

Each of the gate drive ICs 110, 120, and 130 may be manufactured as a driving chip. Each of the gate drive ICs 110, 120, and 130 may be mounted on a gate flexible film 21. The gate flexible film 21 may be provided in plurality. Each of the plurality of gate flexible films 21 may be implemented as a chip-on-film (COF) type. The COF may include a base film, such as polyimide, and a plurality of internal lines IL provided on the base film. The internal lines IL may be a plurality of conductive lead lines. The gate flexible films 21 may be bent or curved. The gate flexible films 21 may be attached on a lower substrate 15 using an anisotropic conductive film, and thus, the gate drive ICs 110, 120, and 130 may be connected to a plurality of gate lines G1 to Gn.

A plurality of source drive ICs 31 may each be manufactured as a driving chip. Each of the source drive ICs 31 may be mounted on a source flexible film 32. The source flexible film 32 may be provided in plurality. Each of the plurality of source flexible films 32 may be implemented as a COF. The source flexible films 32 may be bent or curved. The source flexible films 32 may be attached on the lower substrate 15 using the anisotropic conductive film. Thus, the source drive ICs 31 may be connected to a plurality of data lines D1 to Dm. Moreover, the source flexible films 32 may be attached on a source printed circuit board (PCB) 50. The source PCB 50 may be implemented as a flexible PCB capable of being bent or curved.

The timing control circuit 40 may be mounted on a control PCB 41. The control PCB 41 and the source PCB 50 may be connected to each other through a flexible PCB (FPCB) 60, such as a flexible flat cable (FFC), a flexible printed circuit (FPC), or the like. Also, the control PCB 41 and the FPCB 60 may be omitted, and in this case, the timing control circuit 40 may be mounted on the source PCB 50.

A start line SL may connect the timing control circuit 40 to a first gate drive IC 110. The start line SL may connect the timing control circuit 40 to the first gate drive IC 110 using a line-on glass A (LOG A).

A carry line CL may connect the gate drive ICs 110, 120, and 130. A first carry line CL1 may connect a first gate drive IC 110 to a second gate drive IC 120. A second carry line CL2 may connect the second gate drive IC 120 to a third gate drive IC 130. The carry line CL may connect the gate drive ICs 110, 120, and 130 using a line-on-glass B (LOG B).

The internal lines IL may connect the gate drive ICs 110, 120, and 130 to the start line SL or the carry line CL which is provided on a display panel in a line-on-glass type. The internal lines IL may be a plurality of conductive lead lines.

Figure 5:
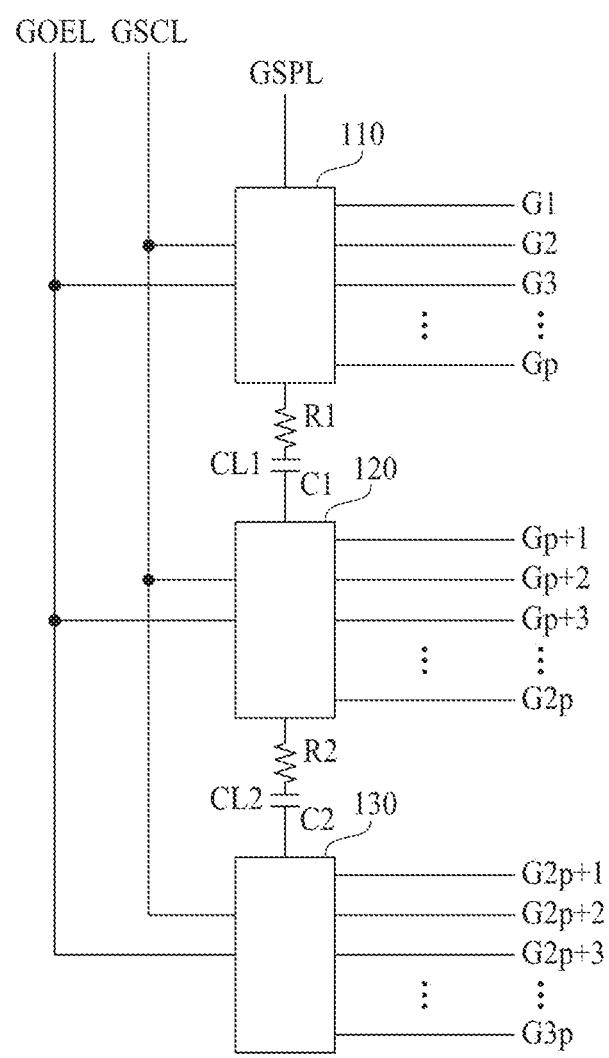
FIG. 5 is a block diagram illustrating the gate drive ICs of FIG. 4.

FIG. 5 is a block diagram illustrating the gate drive ICs of FIG. 4. In FIG. 5, a display device is illustrated as including three gate drive ICs 110, 120, and 130 dependently connected to each other, but the present invention is not limited thereto. That is, the display device may include s (where s is a positive integer equal to or more than two) gate drive ICs that are dependently connected to each other.

As shown in FIG. 5, the first gate drive IC 110 may be connected to a gate start signal line GSPL, a gate shift clock line GSCL, and a gate output enable signal line GOEL. Also, the first gate drive IC 110 may be connected to first to pth gate lines G1 to Gp (where p is a positive integer equal to or more than two). Also, the first gate drive IC 110 may be connected to the first carry line CL1.

The first gate drive IC 110 may generate first to pth gate signals, which are sequentially output based on a start pulse input through the gate start signal line GSPL, a gate shift clock input through the gate shift clock line GSCL, and a gate output enable signal input through the gate output enable signal line GOEL. The first gate drive IC 110 may output the first to pth gate signals to the first to pth gate lines G1 to Gp. The first gate drive IC 110 may output a modulation start pulse, including a first logic level L1 and a second logic level L2 higher than the first logic level L1, to the first carry line CL1. In this case, the first gate drive IC 110 may output the modulation start pulse having the second logic level L2 when a logic level of the start pulse is a third logic level L3 which is higher than the first logic level L1 and lower than the second logic level L2.

The first carry line CL1 may connect the first gate drive IC 110 to the second gate drive IC 120 and may receive the modulation start pulse output from the first gate drive IC 110 to input a first carry pulse to the second gate drive IC 120. Due to a parasitic resistance component of a parasitic resistor R1 and a parasitic capacitance component of a parasitic capacitor C1 that are provided in the first carry line CL1, the first carry pulse may be further delayed than the modulation start pulse and may be input to the second gate drive IC 120.

The second gate drive IC 120 may be connected to the first carry line CL1, the gate shift clock line GSCL, and the gate output enable signal line GOEL. Also, the second gate drive IC 120 may be connected to p+1st to 2pth gate lines Gp+1 to G2p. Also, the second gate drive IC 120 may be connected to the second carry line CL2.

The second gate drive IC 120 may generate p+1st to 2pth gate signals, which are sequentially output based on the first carry pulse input through the first carry line CL1, the gate shift clock input through the gate shift clock line GSCL, and the gate output enable signal input through the gate output enable signal line GOEL. The second gate drive IC 120 may output the p+1st to 2pth gate signals to the p+1st to 2pth gate lines Gp+1 to G2p. The second gate drive IC 120 may output a first modulation carry pulse to the second carry line CL2. In this case, when the first carry pulse having a logic level equal to or higher than the third logic level L3 is input, the second gate drive IC 120 may output the first modulation carry pulse having the second logic level L2.

The second carry line CL2 may connect the second gate drive IC 120 to the third gate drive IC 130 and may receive the first modulation carry pulse output from the second gate drive IC 120 to input a second carry pulse to the third gate drive IC 130. Due to a parasitic resistance component of a parasitic resistor R2 and a parasitic capacitance component of a parasitic capacitor C2, which are provided in the second carry line CL2, the second carry pulse may be further delayed than the first modulation carry pulse, and may be input to the third gate drive IC 130.

The third gate drive IC 130 may be connected to the second carry line CL2, the gate shift clock line GSCL, and the gate output enable signal line GOEL. Also, the third gate drive IC 130 may be connected to 2p+1st to 3pth gate lines G2p+1 to G3p.

The third gate drive IC 130 may generate 2p+1st to 3pth gate signals which are sequentially output, based on the second carry pulse input through the second carry line CL2, the gate shift clock input through the gate shift clock line GSCL, and the gate output enable signal input through the gate output enable signal line GOEL. The third gate drive IC 130 may output the 2p+1st to 3pth gate signals to the 2p+1st to 3pth gate lines G2p+1 to G3p.

In an example embodiment of the present invention, a front-end gate drive IC of an rth (where r is a positive integer satisfying 2≤r≤s) gate drive IC may be an r−1st gate drive IC. A rear-end gate drive IC of the rth gate drive IC may be an r+1st gate drive IC. Also, a front-end carry pulse input to the rth gate drive IC may denote an r−1st carry pulse output through an r−1st carry line. As described above, the first to third gate drive ICs 110, 120, and 130 may be dependently connected to each other, and may sequentially generate gate signals. Thus, the gate signals may be sequentially supplied to first to 3pth gate lines G1 to G3p.

Figure 6:
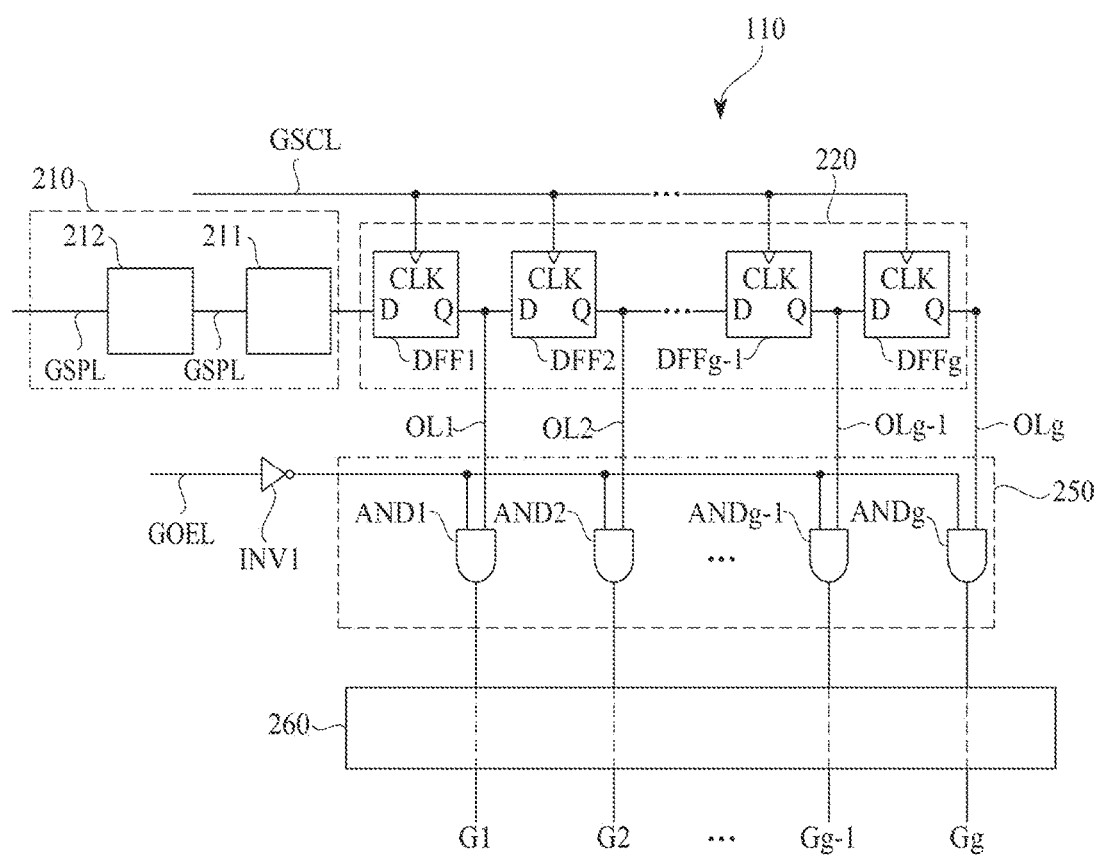
FIG. 6 is a circuit diagram illustrating in detail a first gate drive IC of FIG. 5.

FIG. 6 is a circuit diagram illustrating in detail the first gate drive IC 110. In FIG. 6, for convenience of description, only the first gate drive IC 110 is illustrated, and each of second to sth gate drive ICs may be implemented identically to the first gate drive IC 110.

As illustrated in FIG. 6, the first gate drive IC 110 may include a start pulse modulator 210, a shift register 220, a logic circuit 250, and a level shifter 260. The start pulse modulator 210 may be connected to the gate start signal line GSPL and may receive the start pulse to output the modulation start pulse. The start pulse may swing between the first logic level L1 and the second logic level L2 higher than the first logic level L1. The modulation start pulse may have the first and second logic levels L1 and L2, and a time when a logic level of the modulation start pulse is shifted may be modulated in comparison with the start pulse.

When the start pulse has the third logic level L3 that is higher than the first logic level L1 and lower than the second logic level L2, the start pulse modulator 210 may output the modulation start pulse having the second logic level L2. Therefore, the modulation start pulse having the second logic level L2 may be output from before the start pulse reaches the second logic level L2.

Each of the second to sth gate drive ICs 120 and 130 may be connected to the carry line and may receive a front-end carry pulse to output a modulation carry pulse. The front-end carry pulse may swing between the first logic level L1 and the second logic level L2 higher than the first logic level L1. The modulation carry pulse may have the first and second logic levels L1 and L2, and a time when a logic level of the modulation carry pulse is shifted may be modulated in comparison with the front-end carry pulse.

When the front-end carry pulse has the third logic level L3 that is higher than the first logic level L1 and lower than the second logic level L2, the start pulse modulator 210 may output the modulation carry pulse having the second logic level L2. Therefore, the modulation carry pulse having the second logic level L2 may be output from before the front-end carry pulse reaches the second logic level L2.

Therefore, even when the start pulse or the front-end carry pulse which is delayed due to resistance and capacitance components of the carry line is supplied, the start pulse modulator 210 may shorten a delay duration and may output the modulation start pulse or the modulation carry pulse. Details of the start pulse modulator 210 will be described below in detail with reference to FIG. 7.

The shift register 220 may receive the modulation start pulse from the start pulse modulator 210. Also, the shift register 220 may be connected to the gate shift clock line GSCL and may receive the gate shift clock. The shift register 220 may sequentially output the modulation start pulse.

The shift register 220 may include g (where g is a positive integer) D flip-flops DFF1 to DFFg, which are dependently connected to each other. The g D flip-flops DFF1 to DFFg may each include an input terminal D, an output terminal Q, and a clock terminal CLK.

The input terminal D of each of the g D flip-flops DFF1 to DFFg may be connected to the start pulse modulator 210 or to an output terminal Q of a front-end D flip-flop. For example, as in FIG. 6, an input terminal D of a first D flip-flop DFF1 may be connected to the start pulse modulator 210, and an input terminal D of each of second to gth D flip-flops DFF2 to DFFg may be connected to an output terminal Q of a front-end D flip-flop.

The output terminal Q of each of the g D flip-flops DFF1 to DFFg may be connected to an input terminal D of a rear-end D flip-flop and a plurality of output lines OL1 to OLg. For example, as shown in FIG. 6, an output terminal Q of each of first to g-1st D flip-flops DFF1 to DFFg-1 may be connected to an input terminal D of a rear-end D flip-flop and first to g-1st output lines OL1 to OLg-1, and an output terminal Q of a gth D flip-flop DFFg may be connected to a gth output line OLg. The clock terminal CLK of each of the g D flip-flops DFF1 to DFFg may be connected to the gate shift clock line GSCL.

The logic circuit 250 may receive modulation start pulses which are sequentially output from the shift register 220. Also, the logic circuit 250 may be connected to a first inverter INV1 connected to the gate enable signal line GOEL and may receive an inversion signal of the gate enable signal GOE. The logic circuit 250 may perform an AND operation on the inversion signal of the gate enable signal GOE and the modulation start pulses which are sequentially output, thereby outputting a signal generated through the AND operation to the level shifter 260.

The logic circuit 250, as illustrated in FIG. 6, may include first to gth logical AND gate circuits. Hereinafter, a logical AND gate circuit may be referred to as an "AND gate circuit." First to gth AND gate circuits AND1 to ANDg may perform an AND operation on the inversion signal of the gate enable signal GOE and the modulation start pulses, which are sequentially output, thereby generating first to gth gate signals. The logic circuit 250 may output the first to gth gate signals to the level shifter 260.

The level shifter 260 may be connected to the logic circuit 250 and may receive output signals of the logic circuit 250. The level shifter 260 may change a voltage swing width of each of the output signals of the logic circuit 250 to a swing width that enables operations of transistors provided in the display panel 10. That is, the level shifter 260 may change the voltage swing width of each of the output signals to a swing width of a turn-on voltage, which turns on the transistors provided in the display panel 10, and a turn-off voltage which turns off the transistors provided in the display panel 10.

As in FIGS. 2 and 3, if each of the transistors provided in the display panel 10 are formed of a metal oxide semiconductor field effect transistor (MOSFET), the turn-on voltage may be set as a gate high voltage for activating gates of the transistors provided in the display panel 10, and the turn-off voltage may be set as a gate low voltage which is lower than the gate high voltage. As a result, the level shifter 260 may output the first to gth gate signals, which swing between the gate low voltage and the gate high voltage, to the first to gth gate lines G1 to Gg.

Figure 7:
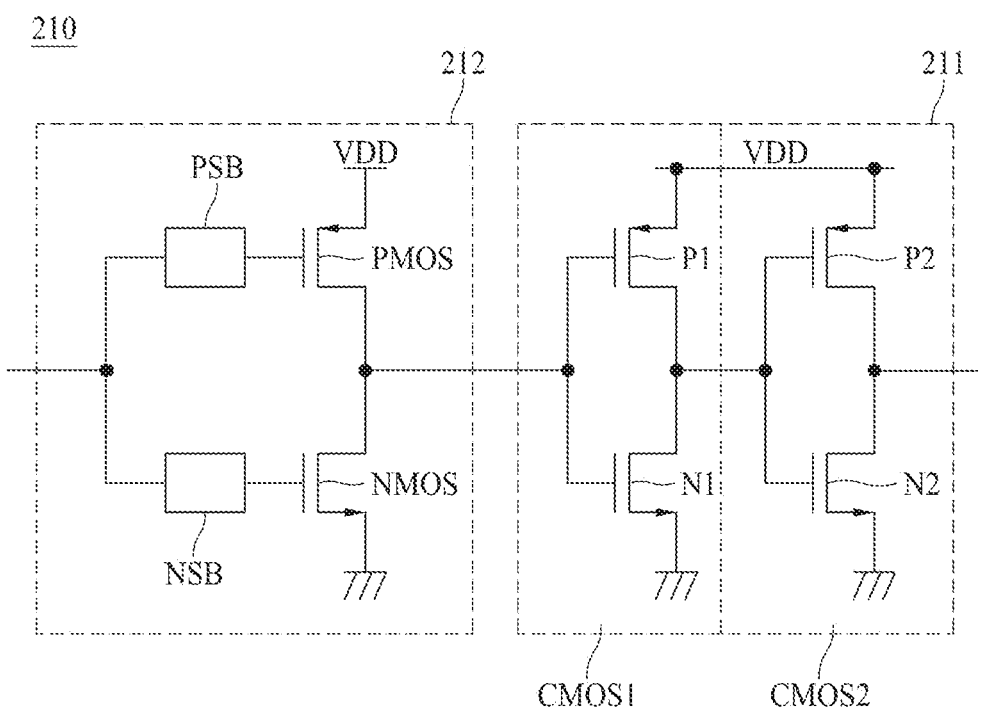
FIG. 7 is a circuit diagram illustrating in detail a start pulse modulator of FIG. 6.

FIG. 7 is a circuit diagram illustrating in detail the start pulse modulator 210 of FIG. 6.

With reference to FIG. 7, the start pulse modulator 210 may include an inverter buffer unit 211 and a noise removal unit 212. The inverter buffer unit 211 may include first and second complementary metal oxide semiconductor (CMOS) units CMOS1 and CMOS2.

The first CMOS unit CMOS1 may include a first P-type MOSFET P1 and a first N-type MOSFET N1. A drain of the first P-type MOSFET P1 may be connected to a drain of the first N-type MOSFET N1, a supply voltage VDD may be supplied to a source of the first P-type MOSFET P1, and a source of the first N-type MOSFET N1 may be connected to a ground. The start pulse may be input to a gate of the first P-type MOSFET P1 and a gate of the first N-type MOSFET N1. An output of the first CMOS unit CMOS1 may be output to the drain of the first P-type MOSFET P1 and the drain of the first N-type MOSFET N1.

The second CMOS unit CMOS2 may include a second P-type MOSFET P2 and a second N-type MOSFET N2. A drain of the second P-type MOSFET P2 may be connected to a drain of the second N-type MOSFET N2, the supply voltage VDD may be supplied to a source of the second P-type MOSFET P2, and a source of the second N-type MOSFET N2 may be connected to the ground. A gate of the second P-type MOSFET P2 and a gate of the second N-type MOSFET N2 may be connected to an output terminal of the first CMOS unit CMOS1. Therefore, the output of the first CMOS unit CMOS1 may be output to the gate of the second P-type MOSFET P2 and the gate of the second N-type MOSFET N2. The modulation start pulse may be input to the drain of the second P-type MOSFET P2 and the drain of the second N-type MOSFET N2.

In the inverter buffer unit 211, a gate voltage corresponding to an input part may be provided between an output voltage and the ground for driving the first and second CMOS units CMOS1 and CMOS2. That is, when the input part has the third logic level L3, the output voltage may have the second logic level L2. Therefore, the start pulse modulator 210 which outputs the second logic level L2 at a time when a signal level is the third logic level L3 is easily implemented by using the inverter buffer unit 211.

In this case, a logic level where an output starts from a drain may be controlled by adjusting an area of an MOSFET. The area of the MOSFET may include an area of a metal part in a gate, an area of a metal part in a drain, and an area of a metal part in a source. The area of the metal part in the gate may denote an area of a metal part in a part to which an input signal is input, instead of a body part of the MOSFET. The first and second P-type MOSFETs P1 and P2 may have a first area. The first and second N-type MOSFETs N1 and N2 may have a second area larger than the first area. In this case, a current may better flow in the first and second N-type MOSFETs N1 and N2 at the same voltage, and thus, the third logic level L3 may be lowered in comparison with the related art. When the third logic level L3 is lowered, an output start time of the inverter buffer unit 211 that outputs the modulation start pulse having the second logic level L2 when the start pulse has the third logic level L3 or more may become earlier. It should be noted that each of the second to sth gate drive ICs 120 and 130 is connected to the carry line and receives a front-end carry pulse to output the modulation carry pulse.

When the third logic level L3 is lowered by adjusting an area of an MOSFET, a time taken until the start pulse or the front-end carry pulse reaches the third logic level L3 may be shortened. Thus, the modulation carry pulse or the modulation start pulse having the second logic level L2 may be output more quickly. Therefore, even when the start pulse or the front-end carry pulse that is delayed due to resistance and capacitance components of the carry line is supplied, the modulation start pulse or the modulation carry pulse where a delay duration is more shortened may be output.

The noise removal unit 212 may be disposed in a front end of the inverter buffer unit 211. When a signal having the second logic level L2 or more which is maintained shorter than a first period T1 is applied, the noise removal unit 212 may output the modulation carry pulse or the modulation start pulse having the first logic level L1, thereby removing noise included in the start pulse or the front-end carry pulse. The noise removal unit 212 may include a positive signal blocking unit PSB, a negative signal blocking unit NSB, a P-type MOSFET PMOS, and an N-type MOSFET NMOS. The noise removal unit 212 may be a glitch removal circuit.

A drain of the P-type MOSFET PMOS may be connected to a drain of the N-type MOSFET NMOS, the supply voltage VDD may be supplied to a source of the P-type MOSFET PMOS, and a source of the N-type MOSFET NMOS may be connected to the ground. The start pulse may be input to a gate of the P-type MOSFET PMOS and a gate of the N-type MOSFET NMOS, and a noise-removed start pulse may be output to the drain of the P-type MOSFET PMOS and the drain of the N-type MOSFET NMOS.

The positive signal blocking unit PSB may be connected to the gate of the P-type MOSFET PMOS, and may block a signal having the second logic level L2 or more, which is maintained shorter than the first period T1, among signals input to the gate of the P-type MOSFET PMOS. The negative signal blocking unit NSB may be connected to the gate of the N-type MOSFET NMOS, and may block a signal having the second logic level L2 or more, which is maintained shorter than the first period T1, among signals input to the gate of the N-type MOSFET NMOS. The first period T1 may be a time for which a noise component having a high frequency component is maintained, and, for example, may be 10 ns or less. Each of the positive signal blocking unit PSB and the negative signal blocking unit NSB may be a low pass filter (LPF) which blocks a high frequency.

The start pulse modulator 210 may have the third logic level L3 which varies. For example, when a rising speed of the start pulse or the front-end carry pulse is fast, the start pulse modulator 210 may have the third logic level L3 approximate to the second logic level L2. When a delay duration of the start pulse or the front-end carry pulse is short, the start pulse modulator 210 may have the third logic level L3 approximate to the second logic level L2. On the other hand, when the rising speed of the start pulse or the front-end carry pulse is slow and the delay duration is long, the start pulse modulator 210 may have the third logic level L3 approximate to the first logic level L1. That is, a level of the third logic level L3 may be proportional to the rise time of the start pulse or the front-end carry pulse and may be inversely proportional to the delay duration.

When the rise time is fast or the delay duration is short, the start pulse modulator 210 may have the third logic level L3, which is relatively high. When the rise time is slow or the delay duration is long, the start pulse modulator 210 may have the third logic level L3, which is relatively low. Therefore, even when the start pulse or the front-end carry pulse which has a difference in each of rising speed and delay duration is input, the third logic level L3 of the start pulse modulator 210 may be set to reach the third logic level L3 at the same time.

Figure 8:
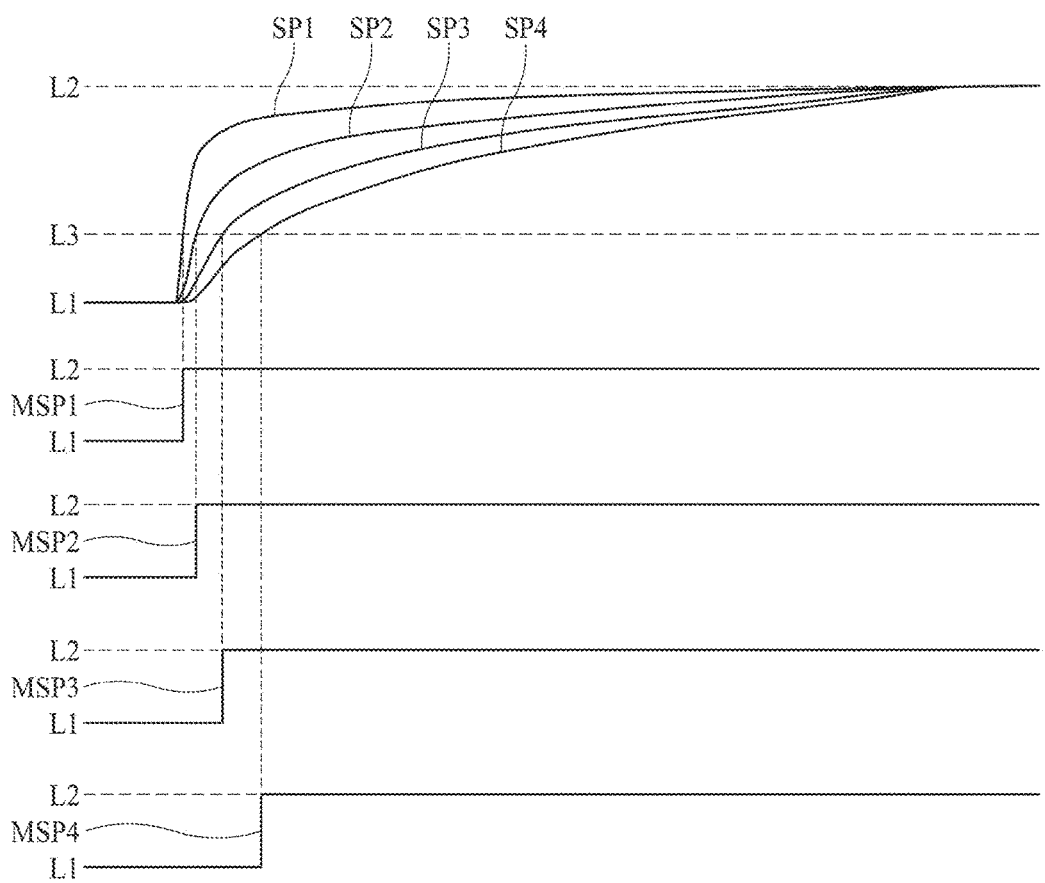
FIGS. 8 and 9 are waveform diagrams showing a start pulse or a front-end carry signal and a modulation start pulse or a modulation carry pulse based thereon.
Figure 9:
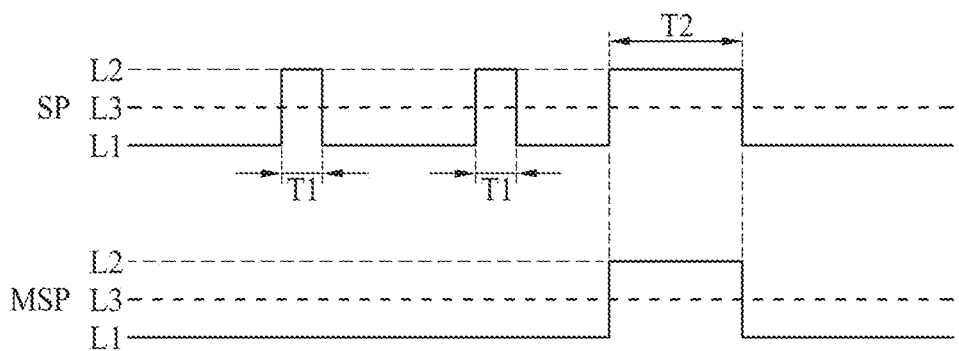

FIGS. 8 and 9 are waveform diagrams showing a start pulse or a front-end carry signal and a modulation start pulse or a modulation carry pulse based thereon.

In FIG. 8, in an example configuration in which four gate drive ICs are provided, a start pulse which is the shortest in delay duration is a first signal SP1, and first to third carry pulses are second to fourth signals SP2 to SP4. Also, a modulation start pulse is a first modulation signal MSP1, and first to third modulation carry pulses are second to fourth modulation signals MSP2 to MSP4. While the present invention is not limited thereto, s (where s is a positive integer equal to or more than two) gate drive ICs that are dependently connected to each other may be provided. Thus, first to sth signals SP1 to SPs and first to sth modulation signals MSP1 to MSPs may be provided.

Each of the first to fourth modulation signals MSP1 to MSP4 may be output at the second logic level L2 at a time when each of the first to fourth signals SP1 to SP4 is at the third logic level L3. A difference between a time when the first signal SP1 reaches the third logic level L3 and a time when the fourth signal SP4 reaches the third logic level L3 may be smaller than a difference between a time when the first signal SP1 reaches the second logic level L2 and a time when the fourth signal SP4 reaches the second logic level L2. Therefore, if each of the first to fourth modulation signals MSP1 to MSP4 is output at the second logic level L2 at a time when each of the first to fourth signals SP1 to SP4 is at the third logic level L3, a delay duration between the first to fourth modulation signals MSP1 to MSP4 is shortened.

That is, if a difference between times when the first to fourth modulation signals MSP1 to MSP4 are output at the second logic level L2 is reduced, a delay of the gate control signal GCS that occurs between the gate drive ICs is reduced, and a pulse width having the second logic level L2 increases. Therefore, a delay of the gate signals is also reduced, and a dimming defect in which a horizontal line parallel to a gate line is visible to a user between the gate drive ICs is prevented.

As shown in FIG. 9, when the start pulse SP having the second logic level L2 is applied during the first period T1, the modulation start pulse MSP or the modulation carry pulse maintains the first logic level L1. On the other hand, when the start pulse SP having the second logic level L2 is applied during a second period T2 that is maintained longer than the first period T1, the modulation start pulse MSP or the modulation carry pulse is shifted to the second logic level L2. Most of noises have a high frequency and a short duration. Thus, if the first period T1 is set identically to a duration of noise that is to be blocked, the modulation start pulse MSP or the modulation carry pulse is prevented from being distorted by noise.

As described above, according to example embodiments of the present invention, the modulation carry pulse or the modulation start pulse having the second logic level may be output at a time when the start pulse or the front-end carry pulse has the third logic level, which is higher than the first logic level and lower than the second logic level. Therefore, the modulation carry pulse or the modulation start pulse having the second logic level may be output before the start pulse or the front-end carry pulse reaches the second logic level. Accordingly, in example embodiments of the present invention, delay duration of the start pulse or the front-end carry pulse is shortened. Thus, the dimming defect where a horizontal line parallel to a gate line between the gate drive ICs seen by a user is prevented.

Moreover, according to example embodiments of the present invention, because an area of a P-type MOSFET is adjusted to be greater than that of an N-type MOSFET in the inverter buffer unit, the third logic level is lowered. Therefore, a time taken until the start pulse or the front-end carry pulse reaches the third logic level is shortened. Thus, the modulation carry pulse or the modulation start pulse having the second logic level is more quickly output. Accordingly, in example embodiments of the present invention, delay duration of the front-end carry pulse or the start pulse is further shortened. Thus, the dim defect where a horizontal line parallel to a gate line is visible to a user is prevented from occurring between the gate drive ICs.

Moreover, according to example embodiments of the present invention, the modulation carry pulse or the modulation start pulse having the first logic level may be output when a signal having the second logic level or higher that is maintained shorter than the first period is applied, and thus, noise included in the start pulse or the front-end carry pulse is removed by the noise removal unit. Accordingly, the modulation start pulse or the modulation carry pulse is prevented from being distorted by noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A gate drive integrated circuit (IC), comprising: a start pulse modulator configured to receive a start pulse or a front-end carry pulse alternating between a first logic level and a second logic level to output a modulation start pulse or a modulation carry pulse that is generated by modulating a logic level shift time of the start pulse or the front-end carry pulse; and a shift register configured to receive and sequentially output the modulation start pulse or the modulation carry pulse, wherein the start pulse modulator is further configured to output the modulation start pulse or the modulation carry pulse having the second logic level at a time when a logic level of the start pulse or the front-end carry pulse has a third logic level between the first logic level and the second logic level,
wherein the start pulse modulator includes an inverter buffer unit configured to receive the start pulse or the front-end carry pulse to output the modulation start pulse or the modulation carry pulse having the first logic level during a period in which the logic level of the start pulse or the front-end carry pulse is equal to or lower than the third logic level,
wherein the inverter buffer unit includes: a first CMOS unit configured to receive the start pulse or the front-end carry pulse as a gate voltage; and a second CMOS unit configured to receive an output voltage of the first CMOS unit as the gate voltage, wherein each of the first CMOS unit and the second CMOS unit comprise a P-type MOSFET and a N-type MOSFET, wherein the P-type MOSFET of each of the first CMOS unit and the second CMOS unit has a first area, and the N-type MOSFET of each of the first CMOS unit and the second CMOS unit has a second area.

2. The gate drive IC of claim 1, wherein a pulse width of the modulation start pulse or the modulation carry pulse is wider than a pulse width of the start pulse or the front-end carry pulse.

3. The gate drive IC of claim 1, wherein the second area is larger than the first area.

4. The gate drive IC of claim 1, wherein the start pulse modulator further includes a noise removal unit configured to output the modulation start pulse or the modulation carry pulse having the first logic level when a signal is applied with the second logic level or higher that is maintained for a period shorter than a first period.

5. The gate drive IC of claim 4, wherein first period is a time for which a noise component having a high frequency component is maintained.

6. The gate drive IC of claim 1, further comprising:
a logic circuit configured to perform an AND operation on an inversion signal of a gate output enable signal from a gate output enable signal line connected with the gate drive IC and the modulation start pulse or the modulation carry pulse that is sequentially output, and to output a plurality of output signals generated through the AND operation; and
a level shifter configured to level-shift the plurality of output signals output from the logic circuit to generate a plurality of gate signals.

7. The gate drive IC of claim 1, wherein the start pulse modulator has the third logic level proportional to a rising speed of the start pulse or the front-end carry pulse.

8. The gate drive IC of claim 4, wherein the noise removal unit includes a positive signal blocking unit, a negative signal blocking unit, a P-type MOSFET, and an N-type MOSFET, wherein the positive signal blocking unit is connected to a gate of the P-type MOSFET and blocks a signal having the second logic level or higher, which is maintained shorter than the first period, among signals input to the gate of the P-type MOSFET; the negative signal blocking unit is connected to a gate of the N-type MOSFET and blocks a signal having the second logic level or higher, which is maintained shorter than the first period, among signals input to the gate of the N-type MOSFET.

9. A display device, comprising: a display panel including a plurality of data lines, a plurality of gate lines, and a plurality of pixels connected to the plurality of data lines and the plurality of gate lines; a gate driver configured to supply gate signals to the plurality of gate lines; a data driver configured to supply data voltages to the plurality of data lines; and a timing control circuit configured to supply a gate control signal to the gate driver and to supply digital video data and a source control signal to the data driver, wherein the gate driver comprises a plurality of gate drive integrated circuits (ICs), each of the plurality of gate drive ICs including a start pulse modulator configured to receive a start pulse or a front-end carry pulse alternating between a first logic level and a second logic level to output a modulation start pulse or a modulation carry pulse that is generated by modulating a logic level shift time of the start pulse or the front-end carry pulse, and wherein the start pulse modulator is further configured to output the modulation start pulse or the modulation carry pulse having the second logic level at a time when a logic level of the start pulse or the front-end carry pulse has a third logic level between the first logic level and the second logic level,
wherein the start pulse modulator includes an inverter buffer unit configured to receive the start pulse or the front-end carry pulse to output the modulation start pulse or the modulation carry pulse having the first logic level during a period in which the logic level of the start pulse or the front-end carry pulse is equal to or lower than the third logic level,
wherein the inverter buffer unit comprises: a first CMOS unit receiving the start pulse or the front-end carry pulse as a gate voltage; and a second CMOS unit receiving an output voltage of the first CMOS unit as the gate voltage, and each of the first CMOS unit and the second CMOS unit comprises a P-type MOSFET and a N-type MOSFET, the P-type MOSFET of each of the first CMOS unit and the second CMOS unit has a first area, and the N-type MOSFET of each of the first CMOS unit and the second CMOS unit has a second area.

10. The display device of claim 9, wherein the start pulse modulator further includes a noise removal unit configured to output the modulation start pulse or the modulation carry pulse having the first logic level when a signal is applied with the second logic level or higher that is maintained for a period shorter than a first period.

11. The display device of claim 10, wherein first period is a time for which a noise component having a high frequency component is maintained.

12. The display device of claim 9, wherein each of the plurality of gate drive ICs further includes:
- a shift register configured to receive and sequentially output the modulation start pulse or the modulation carry pulse;
- a logic circuit configured to perform an AND operation on an inversion signal of a gate output enable signal from the timing control circuit and the modulation start pulse or the modulation carry pulse that is sequentially output, and to output a plurality of output signals generated through the AND operation; and
- a level shifter configured to level-shift the plurality of output signals output from the logic circuit to generate a plurality of gate signals.

13. The display device of claim 9, wherein the second area is larger than the first area.

14. The display device of claim 10, wherein the noise removal unit includes a positive signal blocking unit, a negative signal blocking unit, a P-type MOSFET, and an N-type MOSFET, wherein the positive signal blocking unit is connected to a gate of the P-type MOSFET and blocks a signal having the second logic level or higher, which is maintained shorter than the first period, among signals input to the gate of the P-type MOSFET; the negative signal blocking unit is connected to a gate of the N-type MOSFET and blocks a signal having the second logic level or higher, which is maintained shorter than the first period, among signals input to the gate of the N-type MOSFET.

* * * * *